(12) United States Patent  
O'Sullivan et al.

(10) Patent No.: US 11,165,434 B2  
(45) Date of Patent: Nov. 2, 2021

(54) LEAKAGE REDUCTION FOR MULTI-FUNCTION CONFIGURABLE CIRCUIT

(71) Applicant: Analog Devices International Unlimited Company, Limerick (IE)

(72) Inventors: Donal G. O'Sullivan, Ardnacrusha (IE); Aidan J. Cahalane, County Clare (IE); Patrick C. Kirby, Limerick (IE); Catherine J. Redmond, Limerick (IE); Derrick Hartmann, Billerica, MA (US); Bride Ni Riagain, Limerick (IE)

(73) Assignee: Analog Devices International Unlimited Company, Limerick (IE)

( * ) Notice: Subject to any disclaimer, the term of this patent is extended or adjusted under 35 U.S.C. 154(b) by 67 days.

(21) Appl. No.: 16/818,623

(22) Filed: Mar. 13, 2020

(65) Prior Publication Data

US 2020/0295771 A1     Sep. 17, 2020

Related U.S. Application Data

(60) Provisional application No. 62/819,264, filed on Mar. 15, 2019.

(51) Int. Cl.
*H03K 19/0175* (2006.01)
*H03M 1/06* (2006.01)
(Continued)

(52) U.S. Cl.
CPC ............ *H03M 1/06* (2013.01); *G01R 31/319* (2013.01); *H03K 19/0185* (2013.01); *H03K 19/017581* (2013.01); *H03M 1/66* (2013.01)

(58) Field of Classification Search
CPC .............. G01R 31/319; G01R 31/2841; G01R 31/3004; H03K 19/0175;
(Continued)

(56) References Cited

U.S. PATENT DOCUMENTS

| 4,646,299 | A | 2/1987 | Schinabeck et al. |
| 5,444,644 | A | 8/1995 | Divjak |

(Continued)

FOREIGN PATENT DOCUMENTS

| CN | 105051709 | 11/2015 |
| CN | 205049922 U | 2/2016 |

(Continued)

OTHER PUBLICATIONS

"U.S. Appl. No. 15/456,160, 312 Amendment dated Oct. 9, 2018", 10 pgs.

(Continued)

*Primary Examiner* — Kurtis R Bahr  
(74) *Attorney, Agent, or Firm* — Schwegman Lundberg & Woessner, P.A.

(57) ABSTRACT

Systems for monitoring or control can include reconfigurable input and output channels. Such reconfigurable channels can include as few as a single terminal and a ground pin, or such channels can include three or four terminal configuration such as for use in four-terminal resistance measurements. Channel reconfiguration can be accomplished such as using software-enabled or firmware-enabled control of channel hardware. Such channel hardware can include analog-to-digital and digital-to-analog conversion capability, including use of a digital-to-analog converter to provide field power or biasing. In an example, compensation can be provided to suppress a leakage current from flowing through a digital output to a load connected to the reconfigurable channel terminal, particularly when the digital output is disabled.

20 Claims, 4 Drawing Sheets

(51) Int. Cl.
*H03M 1/66* (2006.01)
*G01R 31/319* (2006.01)
*H03K 19/0185* (2006.01)

(58) Field of Classification Search
CPC ....... H03K 19/017581; H03K 19/0185; H03K 19/17764; H03M 1/06; H03M 1/66
See application file for complete search history.

(56) References Cited

U.S. PATENT DOCUMENTS

| | | | |
|---|---|---|---|
| 5,467,024 A * | 11/1995 | Swapp | G01R 31/2851 324/73.1 |
| 5,557,672 A | 9/1996 | Perry et al. | |
| 7,171,542 B1 | 1/2007 | Alfano et al. | |
| 7,271,752 B2 | 9/2007 | Stoll | |
| 7,369,078 B2 | 5/2008 | Nickel et al. | |
| 7,903,008 B2 | 3/2011 | Regier | |
| 7,912,562 B2 | 3/2011 | Dute et al. | |
| 8,009,078 B1 | 8/2011 | Alley | |
| 8,054,208 B2 | 11/2011 | Fletcher et al. | |
| 8,326,391 B2 | 12/2012 | Rantala | |
| 8,373,586 B2 | 2/2013 | Alley et al. | |
| 8,392,626 B2 | 3/2013 | Wormmeester et al. | |
| 8,558,578 B1 | 10/2013 | Byrkett et al. | |
| 8,604,862 B2 | 12/2013 | Birk et al. | |
| 8,656,065 B1 | 2/2014 | Gerhart et al. | |
| 8,797,025 B2 | 8/2014 | Regier et al. | |
| 8,806,085 B2 | 8/2014 | Mathason et al. | |
| 8,891,217 B2 | 11/2014 | Bucsa et al. | |
| 8,924,600 B2 | 12/2014 | Alley et al. | |
| 9,116,531 B2 | 8/2015 | Alley et al. | |
| 9,520,880 B2 | 12/2016 | Eversmann et al. | |
| 10,014,872 B2 | 7/2018 | Lovell et al. | |
| 10,181,853 B2 | 1/2019 | Slattery et al. | |
| 10,228,399 B2 | 3/2019 | Mcbride et al. | |
| 10,261,932 B2 | 4/2019 | Snyder et al. | |
| 10,432,412 B2 | 10/2019 | Alley et al. | |
| 2003/0057990 A1 | 3/2003 | West | |
| 2006/0100812 A1 | 5/2006 | Sturges et al. | |
| 2006/0132158 A1 | 6/2006 | Miller | |
| 2006/0202707 A1 * | 9/2006 | Harjung | G01R 31/3004 324/756.04 |
| 2009/0167357 A1 | 7/2009 | Lai et al. | |
| 2010/0125426 A1 * | 5/2010 | Kurtz | G01L 19/0092 702/53 |
| 2010/0306518 A1 | 12/2010 | Suryawanshi | |
| 2012/0306517 A1 * | 12/2012 | Regier | G01R 31/2841 324/750.01 |
| 2016/0056823 A1 | 2/2016 | Ho et al. | |
| 2017/0010994 A1 | 1/2017 | Stoll | |
| 2017/0133842 A1 | 5/2017 | Freeman et al. | |
| 2017/0264295 A1 * | 9/2017 | Slattery | H03K 19/17764 |

FOREIGN PATENT DOCUMENTS

| | | |
|---|---|---|
| JP | 2012501443 A | 1/2012 |
| JP | 2018133016 A | 8/2018 |
| WO | WO-2013184668 A2 | 12/2013 |
| WO | WO-2017153847 | 9/2017 |

OTHER PUBLICATIONS

"U.S. Appl. No. 15/456,160, Non Final Office Action dated Jan. 12, 2018", 12 pgs.
"U.S. Appl. No. 15/456,160, Notice of Allowance dated Sep. 12, 2018", 8 pgs.
"U.S. Appl. No. 15/456,160, PTO Response to Rule 312 Communication dated Dec. 17, 2018", 2 pgs.
"U.S. Appl. No. 15/456,160, Response filed May 14, 2018 to Non Final Office Action dated Jan. 12, 2018", 11 pgs.
"Fully Programmable Universal Analog Front End for Process Control Applications", Analog Devices, Circuit Note CN-0209, (Jan. 2011), 5 pgs.
"International Application Serial No. PCT/IB2017/000353, International Preliminary Report on Patentability dated Sep. 20, 2018", 12 pgs.
"International Application Serial No. PCT/IB2017/000353, International Search Report dated Jul. 3, 2017", 4 pgs.
"International Application Serial No. PCT/IB2017/000353, Written Opinion dated Jul. 3, 2017", 10 pgs.
"Quad Channel, 16-Bit, Serial Input, 4 mA to 20 mA and Voltage Output DAC, Dynamic Power Control, HART Connectivity", Analog Devices—AD5755-1, (Apr. 2011), 52 pgs.
"Quad Parametric Measurement Unit with Integrated 16-Bit Level Setting DACs", Analog Devices—AD5522, (Jul. 2008), 65 pgs.
"Super universal modules TXM1.8X TXM1.8X-ML", Siemens 8174, (Mar. 30, 2007), 10 pgs.
"User Defined Fault Protection and Detection, 10 Ω RON, Quad Channel Protector", Analog Devices—ADG5462F, (Jan. 2016), 30 pgs.
Slattery, Colm, et al., "PLC Evaluation Board Simplifies Design of Industrial Process-Control Systems", Analog Dialog 43-04, (Apr. 2009), 8 pgs.
"Chinese Application Serial No. 201780016481.7, Office Action dated Mar. 17, 2020", w/ English Translation, 8 pgs.
"European Application Serial No. 17716987.7, Communication pursuant to Article 94(3) EPC dated Apr. 14, 2020", 6 pgs.
"Chinese Application Serial No. 201780016481.7, Response filed Aug. 3, 2020 to Office Action dated Mar. 17, 2020", w/English Claims, 18 pgs.
"Chinese Application Serial No. 201780016481.7, Office Action mailed Nov. 4, 2020", w/ English Translation, 10 pgs.
"Chinese Application Serial No. 201780016481.7, Response filed Jan. 19, 2021 to Office Action dated Nov. 4, 2020", w/English Claims, 10 pgs.

* cited by examiner

LEAKAGE REDUCTION FOR MULTI-FUNCTION CONFIGURABLE CIRCUIT

This patent application claims the benefit of priority of O'Sullivan et al., U.S. Provisional Patent Application Ser. No. 62/819,264, titled "LEAKAGE REDUCTION FOR MULTI-FUNCTION CONFIGURABLE CIRCUIT," filed on Mar. 15, 2019, the entirety of which is hereby incorporated by reference herein.

FIELD OF THE DISCLOSURE

This document pertains generally, but not by way of limitation, to analog and digital interface circuits, and more particularly to interface circuits having configurable analog and digital operational modes.

BACKGROUND

Electronic modules can be used to facilitate monitoring or control for applications such as chemical or industrial process control, motion control, building control such as for control of Heating, Ventilation, and Air Conditioning (HVAC), and Supervisory Control and Data Acquisition (SCADA). Such modules can have hardware interfaces that provide current or voltage output, and separate inputs such as for monitoring current, voltage, or resistance (such as for measurement using Resistance Temperature Devices (RTDs)). Electronic modules can provide signal conditioning, such as including one or more of filtering or protection devices, and can provide analog-to-digital conversion capability.

SUMMARY OF THE DISCLOSURE

Mechanical and hardware configurations for electronic modules used for control or monitoring can be highly complex, particularly when large channel counts are used. In one approach, dedicated hardware interface channels can be used, such as configured exclusively for current or voltage mode operation and configured exclusively for use as an input channel or an output channel. Such dedicated channels can be coupled to mechanical terminals (e.g., screw terminals). To provide input capability, a group of input channels are generally permanently configured as inputs. Similarly, to provide output capability, a group of output channels are generally permanently configured as outputs. However, such an approach can have disadvantages. For example, instead of having two physical terminals per channel, each input or output can have two or more terminals. An output configured to support current or voltage mode operation might include three or even four terminals. Such extra dedicated terminals can needlessly clutter a hardware interface, and dedicated channel arrangements may hinder flexibility because system requirements or a particular application may dictate an evolving assignment of a particular hardware channel.

The present inventors have also recognized, among things, that systems for monitoring or control can instead include one or more reconfigurable channels, such as including respective channels configurable for use as either an input or an output channel. Such reconfigurable channels can each include as few as a single non-ground terminal and a ground or reference terminal, or such channels can include a three or a four terminal configuration such as for use in three-terminal or four-terminal resistance measurements.

Channel reconfiguration can be accomplished such as using software-enabled or firmware-enabled control of channel hardware. Such channel hardware can include analog-to-digital and digital-to-analog conversion capability, including use of a digital-to-analog converter to provide field power or biasing. In this manner, a complexity of a hardware interface (e.g., a count of physical interface channels connected to terminals, such as screw terminals) can be reduced as compared to non-configurable approaches, because particular channels can be configured flexibly to function as either an input, an output, or a combination of both (such as an input where the channel can also provide field power output, stimulus, or a bias signal).

The present inventors have recognized that a leakage current (e.g., an unwanted current) may exist even when certain circuitry, such as a digital output portion of a configurable channel, is switched off or otherwise disabled. Such a leakage current can introduce error in a value of a current being sourced or sunk by a configurable channel when the channel is operating in an analog mode (e.g., sourcing or sinking a specified current). To suppress such error, compensation can be provided to suppress a leakage current from flowing through a digital output to a load connected to the reconfigurable channel terminal, particularly when the digital output is disabled. Examples shown and described herein are generally applicable to leakage compensation for circuit topologies where a digital output can source current or sink current, respectively.

In an example, a system or other apparatus can include a configurable interface circuit supporting selectable operational modes, the configurable interface circuit comprising a digital output block configured to establish a specified digital current signal or digital voltage signal via an output terminal with the digital output block enabled, the output terminal defining a portion of a configurable channel, an analog block configured to establish a specified analog current via the output terminal with the digital output block disabled, and a buffer circuit configured to route a leakage current associated with the digital output block away from the output terminal with the digital output block disabled.

For example, the configurable interface circuit can include a control circuit configured to establish an operational mode for the configurable channel, the operational mode selected from a list comprising at least one analog mode and at least one digital mode, where the buffer circuit is configured to route the leakage current associated with the digital output block away from the output terminal with an analog mode selected. The at least one analog mode can include at least one of an analog current source mode or an analog current sink mode. The digital output block can be configured to at least one of source or sink the specified digital current signal corresponding to a specified digital output state with a digital mode selected.

In an example, a technique such as a method can include suppressing leakage in a configurable interface circuit supporting selectable operational modes, where the method comprises, in a digital mode, establishing a specified digital current signal or digital voltage signal via an output terminal, the output terminal defining a portion of a configurable channel, with the digital mode de-selected, in an analog mode, establishing a specified analog current via the output terminal, and with the digital mode de-selected, routing a leakage current away from the output terminal, the leakage current associated with a digital block used in the digital mode.

For example, the analog mode can include at least one of an analog current source mode or an analog current sink mode, and establishing the specified digital current signal or the digital voltage signal via the output terminal can include at least one of sourcing a specified current or sinking a specified current corresponding to a specified digital output state in the digital mode.

This summary is intended to provide an overview of subject matter of the present patent application. It is not intended to provide an exclusive or exhaustive explanation of the invention. The detailed description is included to provide further information about the present patent application.

Figure 1:
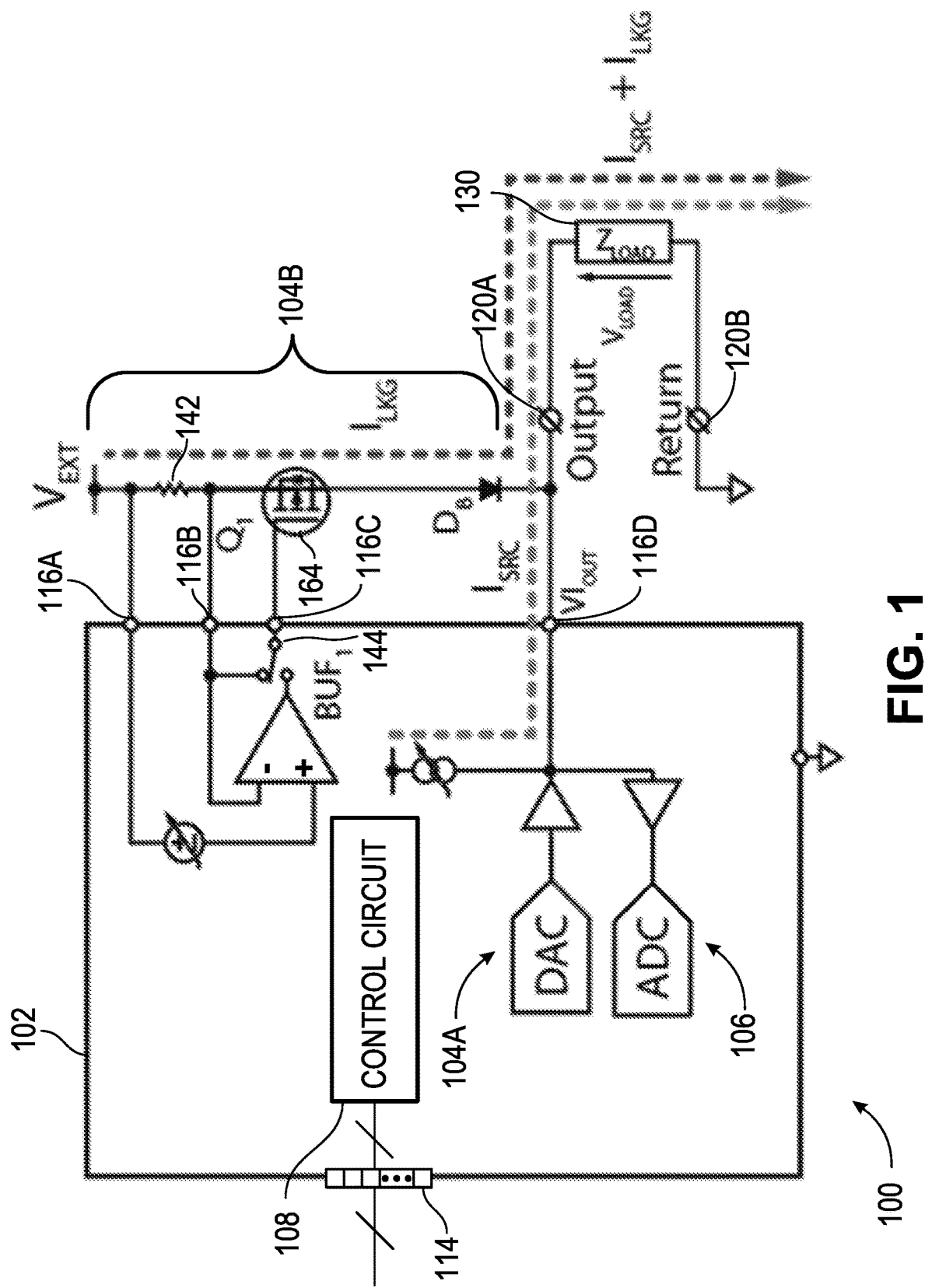
FIG. 1 illustrates generally an illustrative example of a configurable interface circuit supporting a digital output mode, such as can also support various analog operational modes, where a digital output is configured to source current.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

As mentioned above, the present inventors have recognized, among other things, that systems for monitoring or control can instead include one or more reconfigurable channels. Such a flexible configuration allows the system to be interconnected with various field devices including various transducers or actuators, as illustrative examples. Such reconfigurable channels can each include as few as a single non-ground terminal and a ground or reference terminal, or such channels can include a three or a four terminal configuration such as for use in three-terminal or four-terminal resistance measurements.

Channel reconfiguration can be accomplished such as using software-enabled or firmware-enabled control of channel hardware. Channel hardware can include one or more analog-to-digital converters (ADCs) or digital-to-analog conversion capability, such as including use of a digital-to-analog converter (DAC) to provide field power or biasing. In this manner, a complexity of a hardware interface (e.g., a count of physical interface channels connected to terminals, such as screw terminals) can be reduced as compared to non-configurable approaches. For example, particular channels corresponding to physical terminals can be configured flexibly to function as either an input, an output, or a combination of both (such as an input where the channel can also provide field power output, stimulus, or a bias signal, as illustrative examples).

In an example, digital-to-analog conversion circuitry, analog-to-digital conversion circuitry, signal conditioning circuitry, and other circuitry such as control logic can be co-integrated using a commonly-shared integrated circuit or integrated module package. Such an integrated circuit or integrated module package can facilitate use of large channel counts by conserving area and simplifying the hardware engineering task when such circuits or module packages are included as a portion of an electronic control or monitoring module. As mentioned above, the present inventors have developed apparatus and techniques as described herein to provide compensation, such as to suppress a leakage current from flowing through a digital output to a load connected to a reconfigurable channel terminal, particularly when the digital output is disabled or otherwise de-selected.

FIG. 1 illustrates generally an illustrative example of a configurable interface circuit 100 supporting a digital operational mode, and such as can also support various analog operational modes, where a digital output is configured to source current when enabled. The circuit 100 that can include a configurable drive circuit (such as including an analog output block 104A comprising a digital-to-analog converter (DAC) and a digital output block 104B) and a configurable measurement circuit 106 (such as including an analog-to-digital converter), where the interface circuit 100 can be coupled to one or more field devices, such as a load device 130. The use of the phrase "field device" can generally refer to one or more of an actuator, sensor, or other device (such as a temperature sensor, e.g., a resistance temperature detector (RTD)).

The load device 130 need not be located a particular distance from the interface circuit 100, but can generally be located remotely with respect to the interface circuit 100. The field devices can be coupled to the interface circuit such as using one or more screw terminals or other electrical interconnections, such as including a first terminal 120A, and a second terminal 120B. In an example, the second terminal 120B can be an exclusive ground return for a single isolated channel or commonly-shared amongst multiple field devices as a ground or common terminal in a group-isolated system. The interface circuit 100 can include an integrated circuit package 102, such as having one or more monolithically-integrated circuits housed with the package 102. A combination of the configurable drive circuit and the configurable measurement circuit 106 can define a configurable channel, and the interface circuit 100 can include multiple channels, such as implemented within the integrated circuit package 102.

In an example, one or more of the configurable drive circuit, the configurable measurement circuit 106, and a control circuit 108 can be co-integrated in a commonly-shared monolithic integrated circuit. The control circuit 108 can include one or more of a state machine, a microcontroller architecture, a general-purpose processor circuit, or can include one or more configurable logic devices, as illustrative examples. A digital interface 114 can be provided, such as providing one or more of a serial or parallel communication interface.

Interface circuit 100 configuration information can be provided such as via the digital interface 114 and can be used by the control circuit to select an operational mode of the interface circuit 100, such as by enabling or disabling various functional elements included in one or more of the configurable drive circuit or the configurable measurement circuit 106. As shown in FIG. 1, an integrated circuit package 102 can include various interface nodes or "pins," such as first and second pins 116A and 116B, such as can be used to control a current associated with the digital output block 104B in a digital operational mode by one or more of controlling or monitoring a voltage across a resistor 142. In the digital operational mode, such as a digital output mode, switching of a digital output current can be performed by a transistor 164, such as field-effect transistor (FET) $Q_1$ as shown in FIG. 1 controlled by a pin 116C. The transistor drive pin 116C can be selectively driven by a buffer circuit $BUF_1$ to establish a specified digital current signal at the output terminal 120A.

For example, when a switch 144 connects pin 116C and the output of $BUF_1$ to a control input of the transistor 164 (e.g., a gate of FET Q1), the transistor 164 can be controlled to provide a path for a specified voltage derived from $V_{EXT}$ to be provided at the output terminal 120A. A resistor 142 can be used, such as to regulate the current provided through the transistor 164. For example, the resistor 142 can be used to establish a specified current or current limit, such as to prevent damage to downstream devices or the transistor 164 during a fault condition, as an illustrative example. As shown in FIG. 1, if a voltage drop across the resistor 142 exceeds a reference voltage provided at a positive input terminal of $BUF_1$, $BUF_1$ can act to reduce a gate-to-source voltage at FET $Q_1$, and the current can be clamped when the voltage across the resistor 142 is at or near the reference voltage established across the inputs to the buffer, $BUF_1$.

The digital output can be inhibited (e.g., disabled or providing a logic-low state, for example), such as by disconnecting the buffer output from $BUF_1$ using switch 144. In FIG. 1, the switch is shown as connecting the gate of FET $Q_1$ to a source terminal, or some other specified terminal such as $V_{EXT}$ (in FIG. 1) or a reference terminal (e.g., ground) in the context of FIG. 3.

A component such as a diode $D_B$ can be used to prevent forward-biasing of a body diode established by the FET $Q_1$. For example, diode $D_B$ can serve as a blocking diode and can include a silicon diode or a Schottky diode, as illustrative examples. Analog signals can be coupled into or out of the integrated circuit package 102 at pin 116D, corresponding to a node labeled $VI_{OUT}$.

Generally, the analog output block 104A and configurable measurement circuit 106 can be used to provide buffered drive or buffered measurement of analog signals such as voltages or currents. The configuration shown in FIG. 1 is a two-wire configuration, but other configurations can be used, such as for performing 2, 3, or 4-wire measurements. Various operational modes can be supported, such as a voltage or current output mode using the analog output block 104A to provide specified analog current signal, or a digital output mode, such as can be provided by the digital output block 104B.

Locations of components of the interface circuit 100 within the integrated circuit package 102 or external to the integrated circuit package 102 are merely illustrative. In the example of FIG. 1, the digital output block 104B can be configured to supply a specified digital current signal, such as established or limited by a corresponding current or power rating of the FET device, $Q_1$. The FET $Q_1$ can include a power metal-oxide-semiconductor FET (MOSFET), external to the integrated circuit package 102, or the FET device, $Q_1$ could be located within the integrated circuit package 102, either as a separate die or included as a portion of a commonly-shared die (e.g., a monolithic implementation). Similarly, the diode $D_B$ could be located externally to the integrated circuit package 102, or within a commonly-shared device package, or integrated monolithically with other portions of the interface circuit 100.

As an illustrative example, the digital output can supply a current in excess of about 100 mA, such as from a supply voltage $V_{EXT}$ node at 10s of volts (e.g., about 12V to about 36V, as illustrative examples). In this manner, the integrated circuit package 102 can have portions powered by a supply node having a magnitude less than the a power supply node, $V_{EXT}$, use to establish the specified digital current signal or digital voltage signal at the output terminal 120A. $V_{EXT}$ may still be connected to the integrated circuit in order to provide a gate drive voltage for transistor $Q_1$, such as to facilitate current clamping or control.

The present inventors have recognized, among other things, that a power FET device can exhibit significant leakage current, (e.g., $I_{LKG}$), even when in the off-state. For example, such leakage current can be on the order of microamps as one or more of temperature or drain-to-source voltage increase. For example, in certain modes of operation, the output terminal 120A can be configured to provide measurement of a load impedance, $Z_{LOAD}$, such as using the ADC to measure a voltage, $V_{LOAD}$, corresponding to a programmed source current, $I_{SRC}$. In such a measurement mode, the digital output block 104B is disabled or otherwise de-selected, placing $Q_1$ in an off-state (e.g., a non-conducting state). As an illustrative example, $Z_{LOAD}$ can correspond to a sensor such as a precision resistance temperature detector (RTD). If $Z_{LOAD}$ is large, the leakage current $I_{LKG}$ can create an error in the total current coupled through the load device 130. Such an error then influences the $V_{LOAD}$ value and can cause an error in an impedance determination to estimate $Z_{LOAD}$ based on a current measurement. The present inventors have recognized that such a challenge can be addressed by establishing a separate path for the leakage current, $I_{LKG}$, such as to route $I_{LKG}$ elsewhere.

Figure 2:
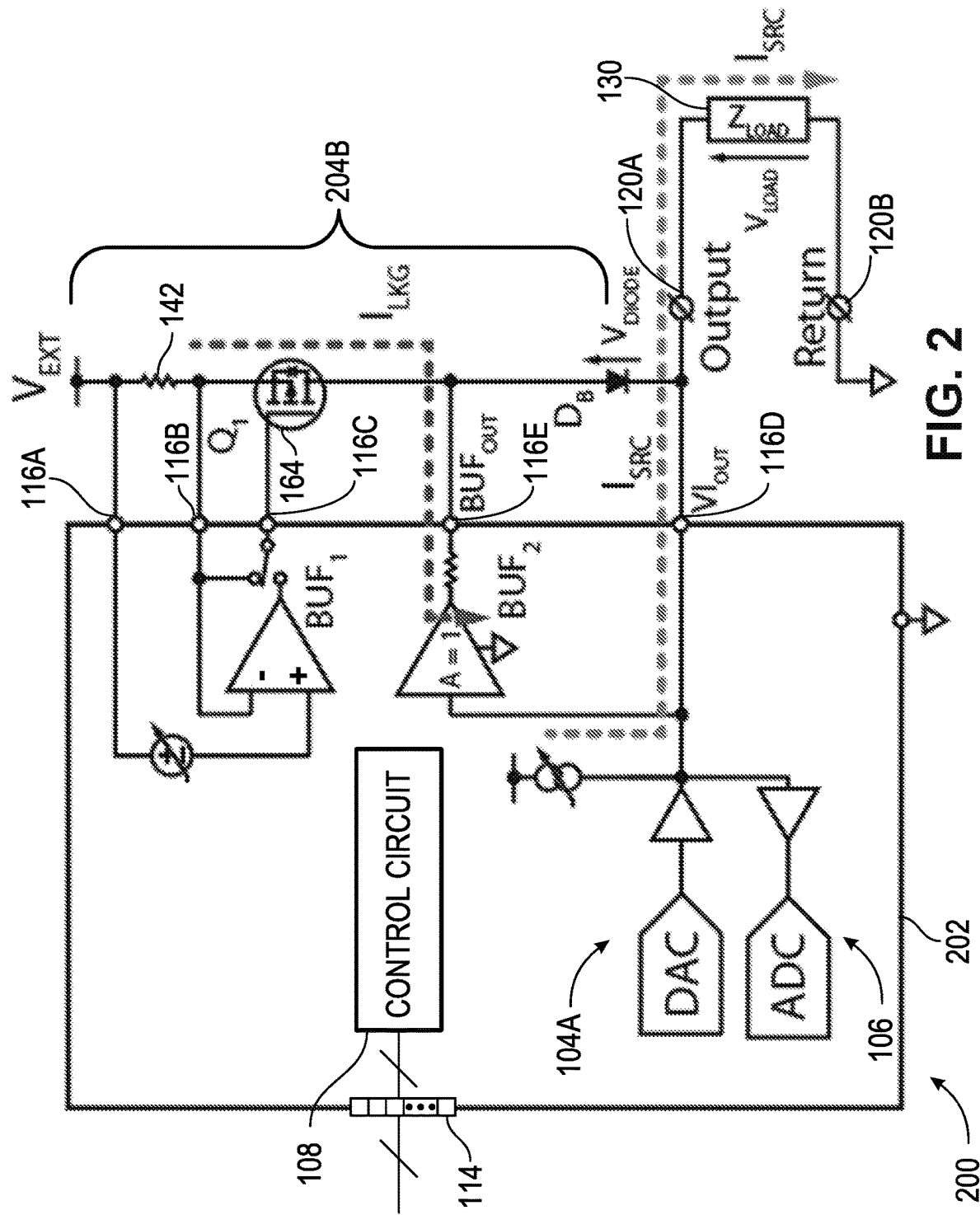
FIG. 2 illustrates generally an illustrative example of a configurable interface circuit supporting a digital output mode and at least one analog operational mode, where a digital output is configured to source current, and where compensation for a leakage current is provided, such as when the digital output is disabled or otherwise de-selected.

FIG. 2 illustrates generally an illustrative example of a configurable circuit 200 supporting a digital output mode and at least one analog operational mode, where a digital output is configured to source current, and where compensation for a leakage current is provided, such as if the digital output is disabled or otherwise de-selected. In the example of FIG. 2, the interface circuit 200 can include a digital output block 204B configured to source a specified digital current signal corresponding to a digital output state (e.g., a logic-high level corresponding to a first specified current or a logic-low level corresponding to a different second specified current). The interface circuit 200 can include an integrated circuit package 202 and an external transistor 164. As in the example of FIG. 1, terminals such as screw terminals 120A and 120B can define a configurable channel of the interface circuit 200.

As in the example of FIG. 1, the integrated circuit package 202 can include one or more pins such as pins 116A and 116B that can be electrical coupled to a resistor 142 for use in monitoring or controlling a current provided by the digital output block 204B. By contrast with the example of FIG. 1, a buffer circuit (e.g., $BUF_2$) can be used to drive the node $BUF_{OUT}$ 116E, such as to route a leakage current away from the output terminal 116D. For example, $BUF_2$ can suppress or inhibit a voltage drop $V_{DIODE}$ across a diode $D_B$ when the analog measurement circuit 106 is being used to measure a voltage at the $VI_{OUT}$ node in response to a specified current $I_{SRC}$ being provided (e.g., an impedance measurement mode), or in another analog operational mode where a digital output block 204B is disabled or otherwise de-selected. For example, in an analog operational mode, the buffer $BUF_2$ can sense a voltage at the $VI_{OUT}$ node, and $BUF_2$ can have an output coupled to a drain of a P-Channel MOSFET (e.g., $Q_1$ as shown in FIG. 2), but isolated from $VI_{OUT}$ by the diode $D_B$. Diode $D_B$ is inhibited from being forward biased while also reducing or inhibiting a reverse bias voltage across the diode. In an example, some limited reverse leakage current in the diode for small reverse bias voltages (e.g., in the range of volts of reverse bias) is acceptable. A trade-off may exist with respect to selection of the type of diode used for diode $D_B$. For example, if $D_B$ is a silicon diode, leakage performance can be improved (e.g., lower leakage) versus a Schottky-type diode structure, but at the expense of a silicon diode providing a greater forward operating voltage as compared to a Shottky-type diode.

As the voltage across the diode ($V_{DIODE}$) is forced to zero (or near zero), a leakage current through the diode is suppressed or inhibited and the leakage current through Q1 is diverted away from the output and into the buffer ($BUF_2$). In this manner, the current flowing through $Z_{LOAD}$ 130 is correct and equal to $I_{SRC}$. While $BUF_2$ is shown as internal to the integrated circuit package 202, $BUF_2$ or other portions of the interface circuit 200 could be located externally. In the illustrative example of FIG. 2, the buffer circuit $BUF_2$ is shown as a unity-gain buffer, but other follower structures can be used. Generally, the $BUF_2$ amplifier can be enabled when the digital output block 204B is disabled, such as when an interface circuit 200 channel is to be operated in an analog measurement or analog output mode and the digital output block 204B is inactive.

Figure 3:
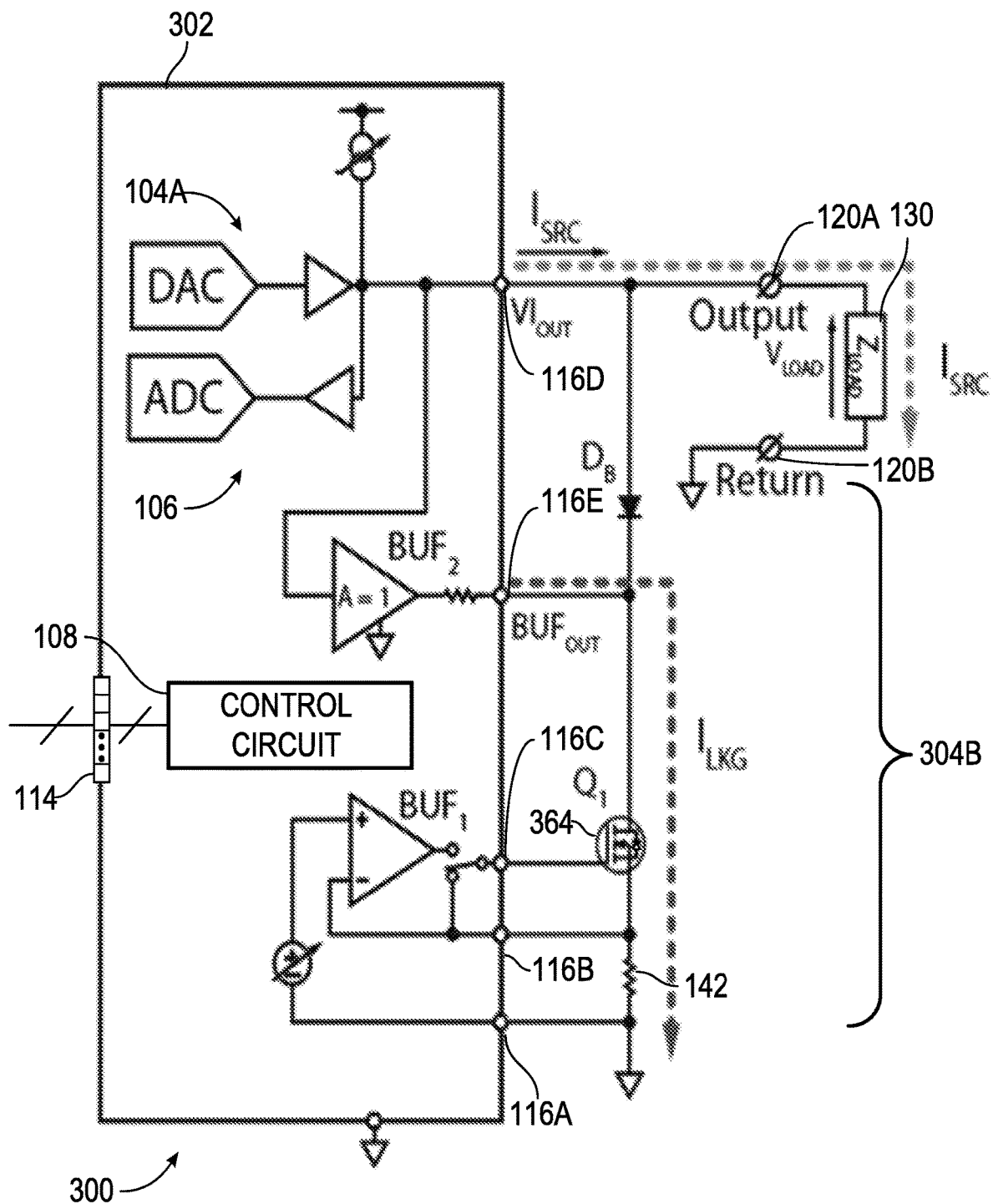
FIG. 3 illustrates generally another illustrative example of a configurable interface circuit having a digital output mode and an analog operational mode, where a digital output is configured to sink current, and where compensation for a leakage current is provided, such as when the digital output is disabled or otherwise de-selected.

FIG. 3 illustrates generally another illustrative example of a configurable interface circuit 300 having a digital output mode and an analog operational mode, where a digital output is configured to sink current when enabled, and where compensation for a leakage current is provided, such as when the digital output is disabled or otherwise de-selected. In the example of FIG. 3, the interface circuit 300 can include a digital output block 304B configured to sink current, such as including an integrated circuit package 302 and an external transistor 364. In a manner similar to FIG. 2, a resistor 142 can be used to monitor or control a current, such as coupled to the integrated circuit package 302 at nodes 116A and 116B. In manner similar to FIG. 2, a separate path is provided for a leakage current, $I_{LKG}$, that diverts such a current away from the load device 130. In FIG. 3, a buffer $BUF_2$ can be used to sense a voltage at the $VI_{OUT}$ pin 116D, and an output of the $BUF_2$ buffer at node 116E can be coupled to a drain of an N-Channel MOSFET (e.g., $Q_1$ 364 as shown in FIG. 3) but isolated from the $VI_{OUT}$ pin 116D via the diode ($D_B$). In this manner, the current through the diode $D_B$ is suppressed or inhibited and the leakage current through Q1 is sourced from $BUF_2$, so that a desired current, $I_{SRC}$ can be established through the load. Generally, as in the example of FIG. 2, the $BUF_2$ amplifier can be enabled when the digital output block 204B is disabled, such as when an interface circuit 200 channel is to be operated in an analog measurement or analog output mode and the digital output block 204B is inactive. In an example, the voltage established at the $VI_{OUT}$ node 116D can be negative with respect to the return node 120B. The techniques described in relation to FIG. 3 are generally applicable in an example where $VI_{OUT}$ is positive.

As in the example of FIG. 1, in FIG. 2 and FIG. 3, an operational mode of the configurable interface circuit 200 and 300 can be established by a control circuit 108. The control circuit 108 can communicate with other devices such as using a digital interface 114. For example, the digital interface 114 can include a serial communication interface such as a Serial Peripheral Interface (SPI) or other digital interface. The control circuit 108 can establish states of configurable switches and registers within the integrated circuit package 202, such as to establish a digital operational mode (e.g., for providing a specified digital signal via the output terminal 120A) or an analog operational mode (e.g., such as to provide analog output or input via the output terminal 120A). For example, analog modes can include one or more of an analog current source mode or an analog current sink mode, such as using one or more of an analog measurement circuit 106 including an analog-to-digital converter circuit or an analog output circuit 104A, such as including a digital-to-analog converter circuit. The analog modes can include one or more impedance measurement modes, such as force-voltage measure-current (FVMI) or force-current measure-voltage (FIMV) modes. In this manner, a configurable channel is provided such as using terminals 120A and 120B.

Figure 4:
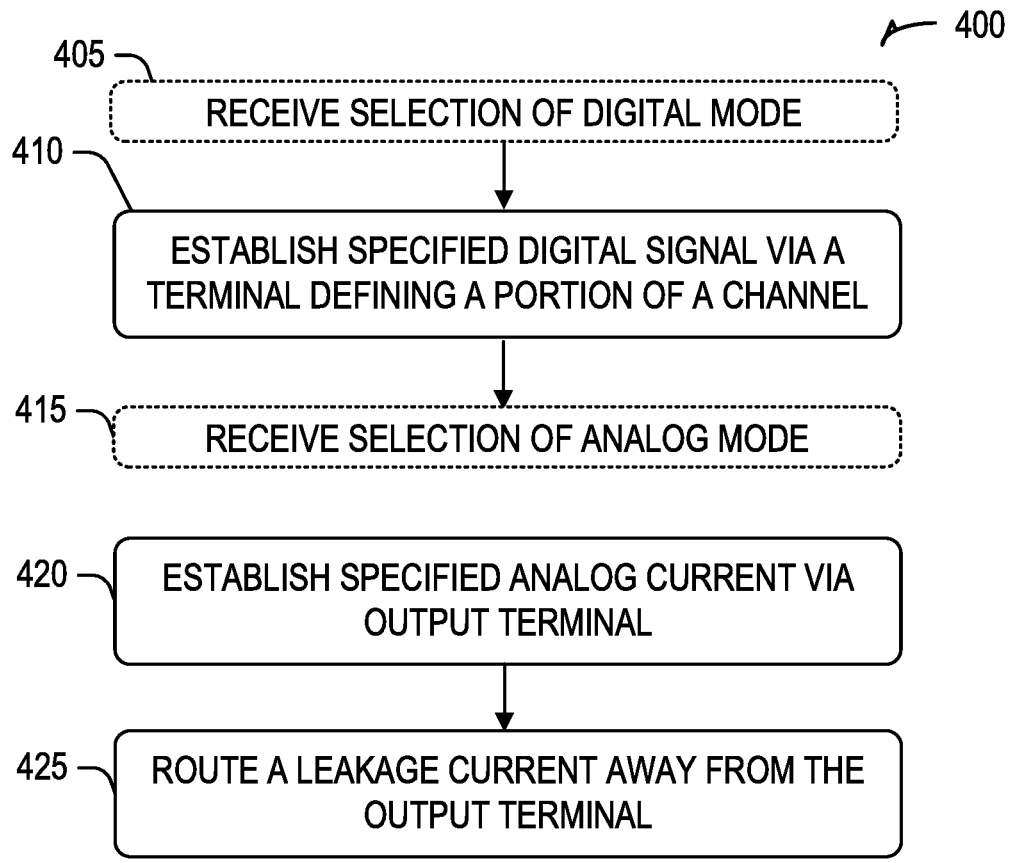
FIG. 4 illustrates generally a technique, such as a method, including, with a digital mode is selected, establishing a specified digital current signal or digital voltage signal via an output terminal, the output terminal defining a portion of a configurable channel, and with the digital mode de-selected, routing a leakage current away from the output terminal, the leakage current associated with a digital block used in the digital mode.

FIG. 4 illustrates generally a technique 400, such as a method. The method of FIG. 4 can be performed using circuitry such as shown and described in relation to other examples herein, such as shown in FIG. 2 or FIG. 3, as illustrative examples. At 405, a selection can be received, such as a configuration selection provided to a control circuit via a digital interface. The configuration selection can indicate that a configurable interface circuit should enable a digital operational mode, such as a digital output mode. At 410, a specified digital signal, such as a specified current level, can be established (e.g., source or sunk by a digital output block of a configurable interface circuit). At 415, a selection of analog mode can be received. As mentioned in relation to other examples herein, the analog mode can be selected from amongst various analog modes and can include an analog current mode such as to source or sink an analog current. The analog mode can include an impedance measurement mode, for example. At 420, a specified analog current can be established, such as via an output terminal included as a portion of a configurable channel. The specified analog current can be associated with an impedance measurement. At 425, such as contemporaneously with the impedance measurement, a leakage current associated with the inactive or de-selected digital output block can be routed away from the output terminal. For example, a buffer circuit as shown and described herein can be used to establish a leakage current path, such as by monitoring a voltage across a component such as a blocking diode.

Various Notes

Each of the non-limiting aspects described in this document can stand on its own, or can be combined in various permutations or combinations with one or more of the other aspects or other subject matter described in this document.

The above detailed description includes references to the accompanying drawings, which form a part of the detailed description. The drawings show, by way of illustration, specific embodiments in which the invention can be practiced. These embodiments are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A configurable interface circuit supporting selectable operational modes, the configurable interface circuit comprising:
    a digital output block configured to establish a specified digital current signal or digital voltage signal via an output terminal with the digital output block enabled, the output terminal defining a portion of a configurable channel;
    an analog block configured to establish a specified analog current via the output terminal with the digital output block disabled; and
    a buffer circuit configured to route a leakage current associated with the digital output block away from the output terminal with the digital output block disabled.

2. The configurable interface circuit of claim 1, comprising a control circuit configured to establish an operational mode for the configurable channel, the operational mode selected from a list comprising at least one analog mode and at least one digital mode; and
    wherein the buffer circuit is configured to route the leakage current associated with the digital output block away from the output terminal with an analog mode selected.

3. The configurable interface circuit of claim 2, wherein the at least one analog mode comprises at least one of an analog current source mode or an analog current sink mode.

4. The configurable interface circuit of claim 2, wherein the digital output block is configured to at least one of source or sink the specified digital current signal corresponding to a specified digital output state with a digital mode selected.

5. The configurable interface circuit of claim 1, wherein the digital output block comprises a component in series with the output terminal; and
    wherein the buffer circuit is configured to suppress a voltage drop across the component with the digital output block selectively disabled.

6. The configurable interface circuit of claim 5, wherein the component comprises a diode.

7. The configurable interface circuit of claim 6, wherein the digital output block comprises a transistor configured to selectively establish the specified digital current signal corresponding to a specified digital output state with a digital mode selected; and
    wherein the diode comprises a blocking diode.

8. The configurable interface circuit of claim 7, wherein at least one of the transistor or the blocking diode are separate from an integrated circuit comprising the buffer circuit and the analog block.

9. The configurable interface circuit of claim 7, wherein at least one of the transistor or the blocking diode are monolithically integrated with an integrated circuit comprising the buffer circuit and the analog block.

10. The configurable interface circuit of claim 9, wherein at least one of the transistor or the blocking diode are external to an integrated circuit package comprising the buffer circuit and the analog block.

11. The configurable interface circuit of claim 6, wherein the buffer circuit is configured to inhibit forward biasing of the diode.

12. The configurable interface circuit of claim 1, wherein the digital output block comprises a transistor configured to selectively establish the specified digital current signal corresponding to a specified digital output state with a digital mode selected; and wherein an integrated circuit comprising the buffer circuit and the analog block is configured to be supplied with a voltage that is lower in magnitude than a supply voltage used to establish the specified digital current signal through the transistor.

13. The configurable interface circuit of claim 1, wherein the analog block comprises a digital-to-analog converter (DAC) circuit configured for use with an analog output mode selected and an analog-to-digital converter for us with analog input mode selected.

14. A method for suppressing leakage in a configurable interface circuit supporting selectable operational modes, the method comprising:
  in a digital mode, establishing a specified digital current signal or digital voltage signal via an output terminal, the output terminal defining a portion of a configurable channel;
  with the digital mode de-selected, in an analog mode, establishing a specified analog current via the output terminal; and
  with the digital mode de-selected, routing a leakage current away from the output terminal, the leakage current associated with a digital block used in the digital mode.

15. The method of claim 14, wherein the analog mode comprises at least one of an analog current source mode or an analog current sink mode; and
  wherein establishing the specified digital current signal or the digital voltage signal via the output terminal comprises at least one of sourcing a specified current or sinking a specified current corresponding to a specified digital output state in the digital mode.

16. The method of claim 14, wherein routing the leakage current away from the output terminal comprises suppressing a voltage drop across a component in series with the output terminal.

17. A configurable interface circuit supporting selectable operational modes, the configurable interface circuit comprising:
  an integrated circuit comprising:
    a digital drive circuit to establish a specified digital current signal or digital voltage signal, in a digital operational mode, via an output terminal at least in part using a transistor external to the integrated circuit, the output terminal defining a portion of a configurable channel;
    a digital interface to receive a selection of an operational mode for the configurable channel;
    an analog block configured to establish a specified analog current via the output terminal in an analog operational mode; and
    a buffer circuit configured to route a leakage current associated with the transistor away from the output terminal in the analog operational mode.

18. The configurable interface circuit of claim 17, wherein the digital drive circuit is included as a portion of a digital output block, the digital output block configured to at least one of source or sink the specified digital current signal corresponding to a specified digital output state in the digital operational mode, through the transistor.

19. The configurable interface circuit of claim 18, wherein the digital output block comprises the transistor and a diode in series with the output terminal, the transistor and diode separate from the integrated circuit.

20. The configurable interface circuit of claim 19, wherein the integrated circuit is configured to be supplied with a voltage that is lower in magnitude than a supply voltage used to establish the specified digital current signal through the transistor; and wherein the buffer circuit is configured to inhibit forward biasing of the diode.

* * * * *